US011211233B2

(12) United States Patent
Ono

(10) Patent No.: US 11,211,233 B2
(45) Date of Patent: Dec. 28, 2021

(54) FILM FORMATION APPARATUS

(71) Applicant: Shibaura Mechatronics Corporation, Yokohama (JP)

(72) Inventor: Daisuke Ono, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 118 days.

(21) Appl. No.: 16/585,525

(22) Filed: Sep. 27, 2019

(65) Prior Publication Data

US 2020/0118803 A1 Apr. 16, 2020

(30) Foreign Application Priority Data

Sep. 28, 2018 (JP) .............................. JP2018-184124
Sep. 6, 2019 (JP) .............................. JP2019-163309

(51) Int. Cl.
*H01J 37/34* (2006.01)
*H01J 37/32* (2006.01)
*C23C 14/34* (2006.01)

(52) U.S. Cl.
CPC .......... *H01J 37/3441* (2013.01); *C23C 14/34* (2013.01); *H01J 37/32633* (2013.01); *H01J 37/32651* (2013.01); *H01J 37/32715* (2013.01); *H01J 37/3447* (2013.01); *H01J 2237/332* (2013.01)

(58) Field of Classification Search
None
See application file for complete search history.

(56) References Cited

U.S. PATENT DOCUMENTS

| 4,450,062 A | * | 5/1984 | Macaulay ............. C23C 14/564 |
| | | | 204/192.3 |
| 2009/0148595 A1 | * | 6/2009 | Nagamine ............. C23C 14/081 |
| | | | 427/131 |
| 2012/0045588 A1 | | 2/2012 | Devito |
| 2017/0275761 A1 | * | 9/2017 | Kamo ............... H01J 37/32559 |

FOREIGN PATENT DOCUMENTS

| JP | 4428873 B2 | 3/2010 |
| KR | 1020180002059 A | 1/2018 |
| TW | 201614082 A | 4/2016 |

* cited by examiner

*Primary Examiner* — Jason Berman
(74) *Attorney, Agent, or Firm* — Nath, Goldberg & Meyer; Jerald L. Meyer

(57) ABSTRACT

According to one embodiment, a film formation apparatus includes a chamber having an interior to be vacuumed, a carrying unit which is provided in the chamber, and which carries a workpiece that has a processing target surface in a solid shape along a circular carrying path, a film formation unit that causes a film formation material to be deposited by sputtering on the workpiece that is being carried by the carrying unit to form a film thereon, and a shielding member which has an opening located at a side where the workpiece passes through, and which forms a film formation chamber where the film formation by the film formation unit is performed. A compensation plate that protrudes in the film formation chamber is provided, and the compensation plate has a solid shape along a shape of the processing target surface of the workpiece, and is provided at a position facing the workpiece.

11 Claims, 9 Drawing Sheets

FILM FORMATION APPARATUS

CROSS-REFERENCE TO RELATED APPLICATION

This application is based upon and claims the benefit of priority from Japan Patent Application Nos. 2018-184124, filed on Sep. 28, 2018 and 2019-163309, filed on Sep. 6, 2019, the entire contents of which are incorporated herein by reference.

FIELD OF THE INVENTION

The present disclosure relates to a film formation apparatus.

BACKGROUND

In manufacturing processes for various kinds of products, such as semiconductors, displays and optical discs, for example, a thin film like an optical film may be formed on a workpiece, such as a wafer or a glass substrate. Such a thin film can be formed by repeating film formation for forming a metal film, etc., on the workpiece, etching on the formed film, and film processing, such as oxidization, or nitridation.

Although film formation and film processing can be performed in various methods, one of such methods is a method by plasma processing. In film formation, a sputter gas is introduced into a chamber that is a vacuumed container in which a target is placed, and a DC voltage is applied to the target. Ions of the plasma sputter gas are caused to collide with the target, and materials beaten out from the target are deposited on the workpiece to form a film. In film processing, a process gas is introduced into a chamber in which an electrode is placed, and a high-frequency voltage is applied to the electrode. Ions of the plasma process gas are caused to collide with the film on the workpiece, and thus film processing is executed.

There is a film formation apparatus (e.g., see Japan Patent No. 4428873) which has a rotation table attached inside a single chamber, and which has plural film formation units and film processing units placed in the circumferential direction of the ceiling of the chamber, i.e., the upper side of the rotation table so as to enable successive execution of such film formation and film processing (both are collectively referred to as a plasma processing below). According to such a structure, individual workpieces are held and carried on the rotation table, and are caused to pass through beneath the respective film formation units and film processing units, thereby an optical film, etc., is formed thereon.

Problem to be Solved by the Invention

In recent years, an antireflection film is formed on a display for a smart phone, etc., so as to improve a visibility. When, however, the antireflection film has a color unevenness, a color unevenness occurs on the display, and it is determined that the visibility is poor. The antireflection film often employs a multilayer structure. Here, it is said that, by setting an allowable film thickness distribution for a film that is a single layer within ±2% from a designed value, human beings do not feel the color unevenness. Hence, in optical applications, a high film thickness uniformity is required. Moreover, for a display in a solid shape that has concavities and convexities like a head-up display that is a workpiece applied for a vehicle, a demand for forming an antireflection film by a film formation apparatus that utilizes sputtering is increasing.

Meanwhile, the above-described film formation apparatus includes a processing chamber, inside the chamber, that is a space where plasma processing is performed. In the processing chamber in which the plasma processing is performed, some sputter particles beaten out from the target collide with reactive gas molecules, and are scattered. Due to these scattered sputter particles, a difference in a film thickness deposited on the workpiece may occurs, and thus there is a possibility such that a uniform film thickness distribution is not obtained on the workpiece. When, in particular, a processing target surface of the workpiece is in a solid shape, the nonuniformity of the film thickness distribution remarkably appears.

SUMMARY OF THE INVENTION

An object of the present disclosure is to provide a film formation apparatus capable of attaining an excellent uniformity of a film thickness distribution.

In order to accomplish the above objective, a film formation apparatus according to the present disclosure includes:

a chamber, an interior of the chamber is capable of being vacuumed;

a carrying unit which is provided in the chamber, and which carries a workpiece that has a processing target surface in a solid shape along a circular carrying path;

a film formation unit that causes a film formation material to be deposited by sputtering on the workpiece that is being carried by the carrying unit to form a film thereon; and a shielding member which has an opening located at a side where the workpiece passes through, and which forms a film formation chamber where the film formation by the film formation unit is performed, in which a compensation plate that protrudes in the film formation chamber is provided, and in which the compensation plate has a solid shape along a shape of the processing target surface of the workpiece, and is provided at a position facing the workpiece.

The workpiece may include a convexity and a flat surface in a surface facing the film formation unit, the shielding member may include a concavity along the convexity of the workpiece in an end of the opening, and the compensation plate may be provided so as to cover a part of the workpiece and the flat surface thereof at the end of the opening of the shielding member.

The compensation plate may be configured to expose a part of the workpiece where a film formation rate is at the minimum level.

A distance between the compensation plate and the processing target surface of the workpiece may be 5 mm or less.

Three circular targets may be further included in the film formation chamber, in which a center of the one target may be shifted from a line that connects respective centers of the two targets among the three targets, and in which the compensation plate may be provided on an opposite side to the one target with respect to the line connecting the centers of the two targets The shielding member may include dividing walls that face with each other in the carrying direction in which the workpiece is carried; and the compensation plate may be attached to the dividing wall at an upstream side in the carrying direction.

The shielding member may include dividing walls that face with each other in the carrying direction in which the workpiece is carried; and the compensation plate may be attached to the dividing walls so as to contact therewith.

According to the present disclosure, a film formation apparatus capable of attaining a uniformity of the film thickness distribution can be provided.

DETAILED DESCRIPTION OF THE EMBODIMENTS

[Structure]

Embodiments of the present disclosure will be described in detail with reference to the figures. In the following description, a direction along a gravity is defined as a downward direction, and conversely, a direction against the gravity is defined as an upward direction.

[Chamber]

Figure 1:
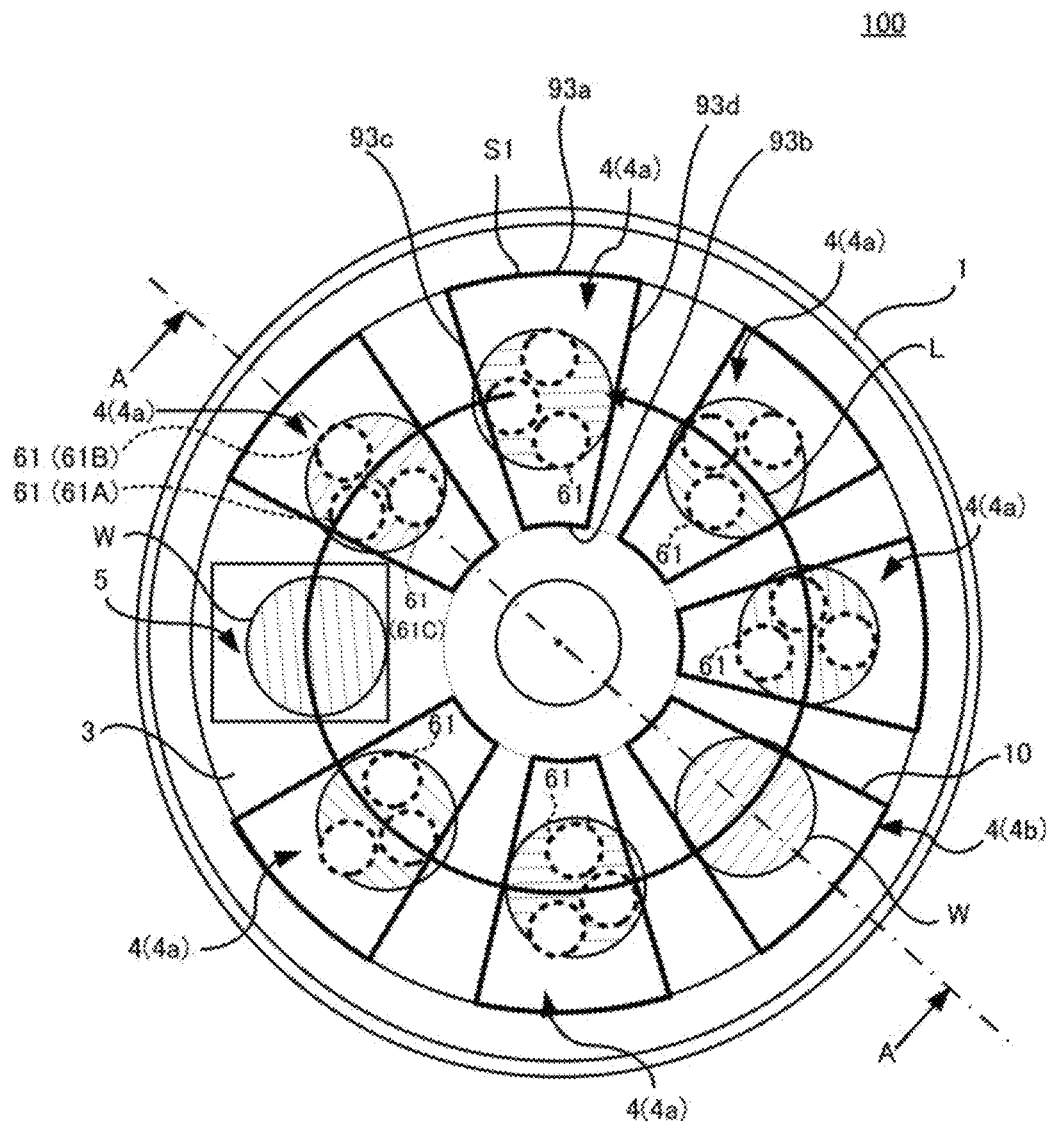
FIG. 1 is a perspective plane view schematically illustrating an example structure of a film formation apparatus according to an embodiment.
Figure 2:
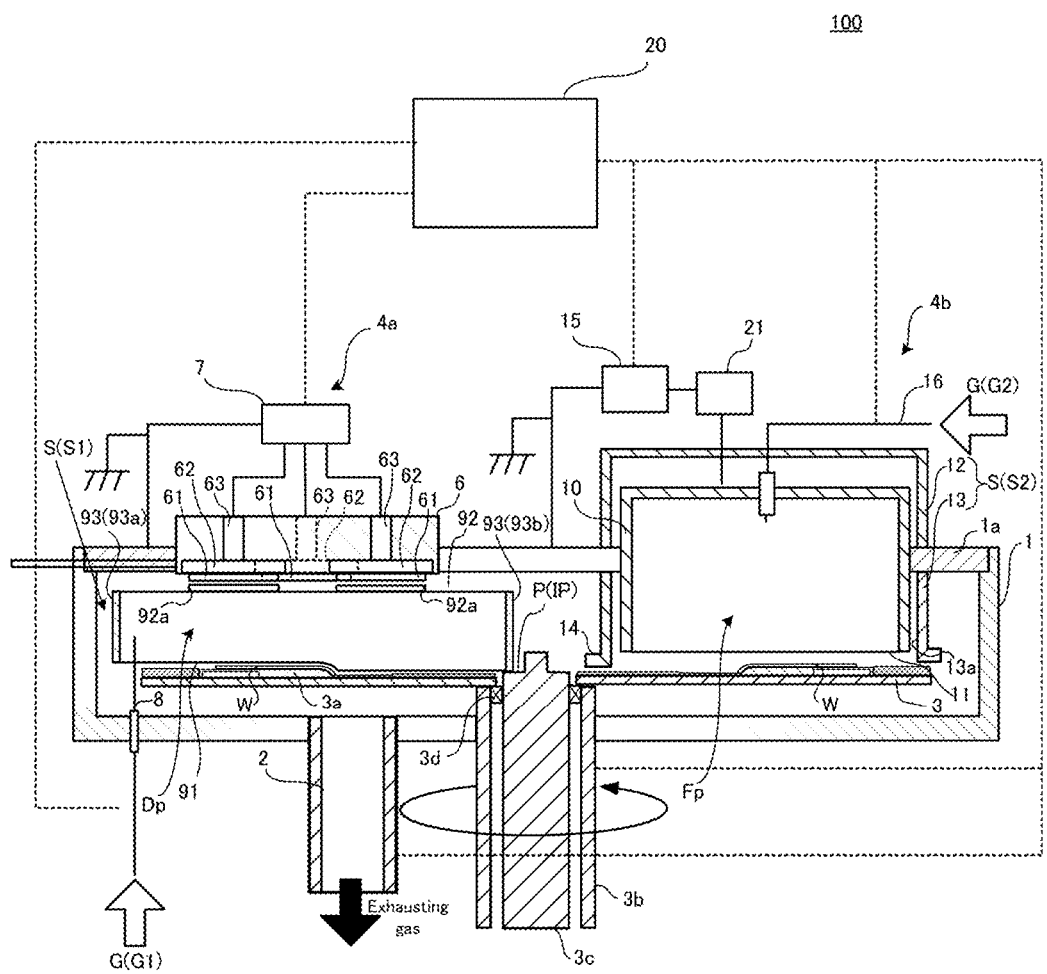
FIG. 2 is a cross-sectional view taken along a line A-A in FIG. 1.

As illustrated in FIGS. 1 and 2, a film formation apparatus 100 includes a chamber 1. The chamber 1 is a container with a bottom in a substantially cylindrical shape. The interior of the chamber 1 can be vacuumed. A lid body 1a that can be opened and closed is provided at an opening of the chamber 1. The lid body 1a is a circular plate member, and hermetically seals the upper portion of the chamber 1. Moreover, the chamber 1 is provided with a exhausting unit 2, enabling the interior of the chamber 1 to be exhausted and vacuumed. That is, the chamber 1 functions as a vacuum container. The exhausting unit 2 includes a pipe connected to a pneumatic pressure circuit that includes an unillustrated vacuum source. A connection location to this pneumatic pressure circuit is a exhausting position. According to this embodiment, the exhausting position is a bottom portion of the chamber 1. Note that according to this embodiment, although the lid body 1a of the chamber 1 is an upper side and the bottom portion is a lower side, the lid body 1a may be the lower side and the bottom portion may be the upper side.

[Rotation Table]

In the chamber 1, a rotation table 3 is horizontally provided as a carrying unit that carries individual workpieces W along a circular carrying path L by rotation. That is, a hollow rotation cylinder 3b passes through the bottom portion of the chamber 1 and stands inside the chamber 1, and the substantially circular rotation table 3 is attached to the rotation cylinder 3b. An unillustrated drive mechanism is coupled to the rotation cylinder 3b. The rotation table 3 rotates around the rotation cylinder 3b by driving the drive mechanism. A stationary supporting strut 3c is placed in the hollow rotation cylinder 3b. The supporting strut 3c is fixed to an unillustrated base mount provided outside the chamber 1, passes through the bottom portion of the chamber 1, and stands inside the chamber 1. An opening is formed at the center of the rotation table 3. The supporting strut 3c passes through the opening of the rotation table 3, and a tip of such a strut is located between the upper surface of the rotation table 3 and the upper surface of the chamber 1. Note that in the following description, the rotation axis of the rotation cylinder 3b is defined as the rotation axis of the rotation table 3. Moreover, a side near the rotation axis of the rotation table 3 is defined as an inner circumference side, and a side apart from the rotation axis is defined as an outer circumference side.

A ball bearing 3d is placed between the opening of the rotation table 3 and the supporting strut 3c. That is, the rotation table 3 is rotatably supported by the supporting strut 3c via the ball bearing 3d. Note that the tip of the supporting strut 3c constitutes an inner-circumference supporting portion IP to be described later.

A plurality of holder units 3a each holding the workpiece W is provided on the upper surface of the rotation table 3. The plurality of holder units 3a is provided at equal intervals along the circumferential direction of the rotation table 3. Rotation of the rotation table 3 moves the workpieces W held by the respective holder units 3a in the circumferential direction of the rotation table 3. In other words, on a surface of the rotation table 3, the carrying path L that is a circumferential moving trajectory of the workpiece W is formed. The holder unit 3a may be a recess, a tray, etc., on which the workpiece W is mounted. The holder unit 3a may be provided with a chuck member, such as an electrostatic chuck, or a mechanical chuck, that holds the workpiece W.

Figure 3A:
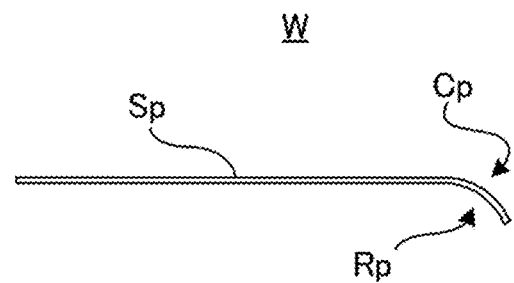
FIG. 3A is a side view.
Figure 3B:
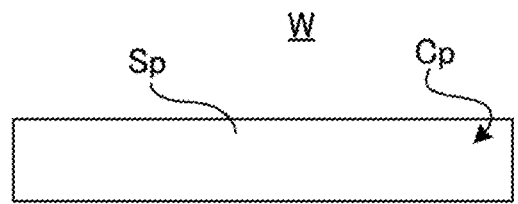
FIG. 3B is a plan view.
Figure 3C:
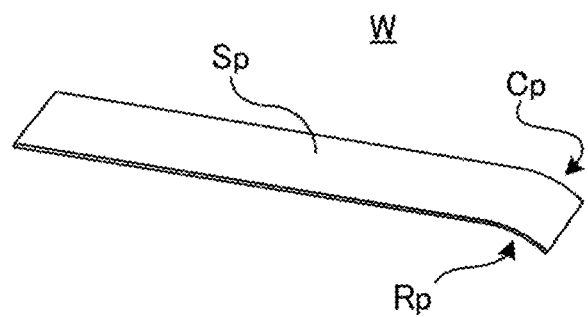
FIG. 3C is a perspective view of a workpiece.

As for an example workpiece W according to this embodiment, as illustrated in FIG. 3A that is a side view, FIG. 3B that is a plan view, and FIG. 3C that is a perspective view, the workpiece is a tabular member which has a convexity Cp on a surface that faces a processing unit to be described later, i.e., a surface to be processed (hereinafter referred to as a processing target surface Sp), and which has a concavity Rp in an opposite surface to the convexity Cp. That is, the processing target surface Sp of the workpiece W is not a flat plate but the processing target surface Sp is in a solid shape that has the convexity Cp or the concavity Rp in part. The convexity Cp means, in the processing target surface Sp, a curved portion that has a curvature center located at the opposite side to the processing target surface Sp, or a portion that couples different planes when the processing target surface Sp is formed by the plurality of planes that have respective different angles (see FIGS. 9A to 9C). The concavity Rp refers to a portion on the opposite side of the convexity Cp.

According to this embodiment, the workpiece W is a substrate in a rectangular shape, and the convexity Cp is formed in the processing target surface Sp by a curved portion formed at one short side. That is, a side that is elongated by a curvature is the convexity Cp, and the opposite side is the concavity Rp. The processing target surface Sp from the convexity Cp of the workpiece W to the other short side is a flat surface. According to this embodiment, the portion of the processing target surface Sp where the convexity Cp is formed is located below the portion of the processing target surface Sp that is a flat surface. That is, the processing target surface Sp is a rectangular surface where the one short side of the workpiece W is curved downwardly. The workpiece W may contain conductive materials, such as metal or carbon, insulation materials, such as glass or rubber, or semiconductor material like silicon.

Figure 4A:
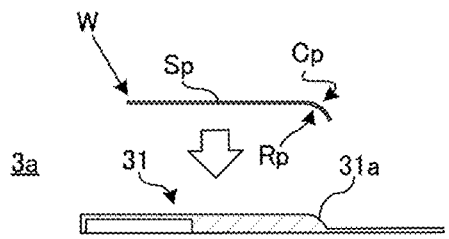
FIG. 4A is a side view.
Figure 4B:
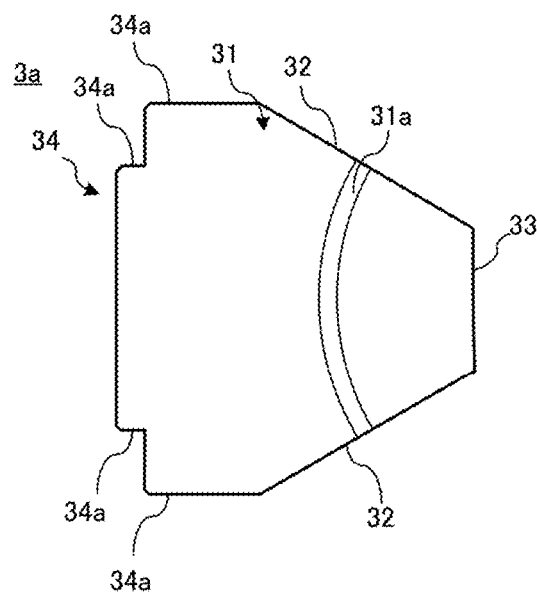
FIG. 4B is a plan view.
Figure 4C:
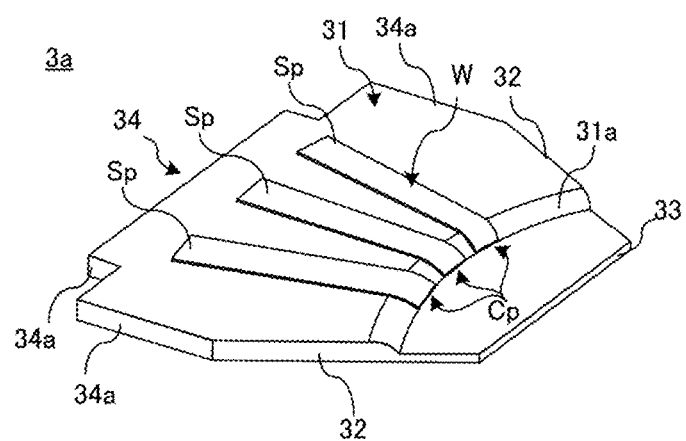
FIG. 4C is a perspective view of a tray that is a holder unit.

As for the holder unit 3a holds the workpiece W mounted thereon, a tray as illustrated in the plan view of FIG. 4B, and the perspective view of FIG. 4C is applicable. In the holder unit 3a, a surface that faces the processing unit to be described later will be referred to as a facing surface 31. According to this embodiment, the holder unit 3a is a substantially sector-shape tabular member, and has inclined surfaces 32 that are a pair of side faces along a V-shape. The term substantially sector shape in this specification means a shape of sectorial portions of a fan. End portions on a side at which the pair of inclined surfaces 32 come close to each other are connected by an inner circumference surface 33 along a straight line. At end portions on a side at which the pair of inclined surfaces 32 of the holder unit 3a become apart from each other, an outer circumference surface 34 along a convex shape formed by combining orthogonal sides is continuous. Parallel surfaces that face with each other in this outer circumference surface 34 will be referred to as restriction surfaces 34a.

Each holder unit 3a has, on the facing surface 31, the convexity 31a along a concavity 90 of a shielding member S1 to be described later, and also a concavity of a shielding member S2. The wordings along the respective concavities of the shielding members S1 and S2 mean a shape follows the respective shapes of the concavities. The convexity 31a of the holder unit 3a faces the respective concavities of the shielding members S1 and S2 in a non-contact manner. According to this embodiment, the convexity 31a is also a curved surface that follows the concavity Rp of the workpiece W. As illustrated in FIG. 4B, the convexity 31a is formed along a circular-arc shape that connects the center of the pair of inclined surfaces 32 in a planar view. The facing surface 31 of the holder unit 3a has, with the convexity 31a being as a boundary, a lower flat surface on the inner-circumference-surface-33 side close to the rotation table 3, and a higher flat surface on the outer-circumference-surface-34 side apart from the rotation table 3.

According to this embodiment, the workpiece W is mounted in such a way that the concavity Rp of the workpiece W matches the convexity 31a of the holder unit 3a. Next, the holder unit 3a is carried into the film formation apparatus 100 in such a way that the respective convexities Cp of the workpieces W are placed at the inner circumference side. With all the holder units 3a being set to the rotation table 3, the lengthwise direction of the workpiece W is along with the radial direction of the rotation table 3. Accordingly, when viewed in the radial direction, the processing target surface Sp of the workpiece W has the concavity and convexity, but becomes a constant height when viewed in the carrying direction (an orthogonal direction to the radial direction).

[Processing Unit]

Processing units 4 that execute processes in respective steps in the film formation apparatus 100 are provided at positions facing the holder units 3a of the rotation table 3. The respective processing units 4 are arranged so as to adjoin to each other with a predetermined interval therebetween along the carrying path L of the workpiece W formed on the surface of the rotation table 3. A process in each step is executed by causing the individual workpieces W held by the respective holder units 3a to pass through the position facing each processing unit 4. Note that the exhausting unit 2 is provided at the opposite side to the processing unit 4 with the rotation table 3 being present therebetween.

According to the example in FIG. 1, the seven processing units 4 are arranged along the carrying path L on the rotation table 3. According to this embodiment, the processing unit 4 that performs a film forming processing on the workpiece W is a film formation unit 4a. The processing unit 4 that performs a process on the film formed on the workpiece W by the film formation unit 4a is a film processing unit 4b. According to this embodiment, the film formation unit 4a forms a film by depositing a film formation material on the workpieces W carried by the rotation table 3 by sputtering using plasma.

Moreover, the film processing unit 4b will be described as the processing unit 4 that performs post-oxidization. The term post-oxidization is a process of, for a metal film formed by the film formation unit 4a, oxidizing the metallic film by oxygen ions produced by plasma. Note that the process by the film processing unit 4b is not limited to this example. For example, post-nitriding that is nitridation of the metallic film by nitrogen ions, etc., produced by plasma may be performed. Moreover, oxidization and nitridation by oxygen ions and nitrogen ions may be performed. The film formation units 4a and the film processing units 4b are arranged with an interval therebetween in the circumferential direction. According to this embodiment, the six film formation units 4a and the single film processing unit 4b are placed. However, at least one film formation unit 4a among the plurality of processing units 4 is sufficient.

(Film Formation Unit)

As illustrated in FIG. 2, the film formation unit 4a includes a sputter source 6. The sputter source 6 is a supply source of film formation materials. The sputter source 6 includes a target 61, a backing plate 62, and an electrode 63. The target 61 is a tabular member formed of film formation materials that are deposited on the workpiece W to become a film. The target 61 is installed at a position facing the workpiece W when the workpiece W passes through the position facing the film formation unit 4a. According to this embodiment, the three circular targets 61 are provided. The two targets 61B and 61C have respective centers aligned in the radial direction of the rotation table 3. The other one target 61A is placed in such a way that the center a thereof is displaced, in the carrying direction, from a line which interconnects the respective centers b and c of the targets 61B and 61C. That is, when the targets 61B and 61C are placed at a substantial center between a dividing wall 93c and a dividing wall 93d to be described later, the target 61A is placed so as to be closer to either the dividing wall 93c or the dividing wall 93d. For example, the one target 61A is arranged at a position that forms a vertex of an isosceles triangle together with the other two targets 61B and 61C (see FIG. 1). However, the number of the targets 61 may be one, two, or four or more. In the following description, when not distinguished, the targets 61A, 61B, and 61C may be referred to as the target 61 in some cases.

The backing plate 62 is a member that holds the target 61. The electrode 63 is a conductive member for applying power to the target 61 from the exterior of the chamber 1. Note that the sputter source 6 includes, as needed, a magnet, a cooling mechanism, and etc.

A DC power supply 7 that applies a DC voltage via the electrode 63 is connected to the target 61. Moreover, a sputter gas introduction unit 8 is installed at the bottom of the chamber 1 in order to introduce a sputter gas G1 into the chamber 1 at a position facing the target 61. The sputter gas G1 causes produced ions by plasma occurred by power application to collide with the target 61, and causes the materials from the target 61 to be deposited on the surface of the workpiece W. An example sputter gas G1 applicable is an inert gas like as argon.

A shielding member S1 is provided at a position surrounding the above-described target 61 of the sputter sources 6. The shielding member S1 forms apart of a gas space where the sputter gas G1 is introduced and has an opening 91 directed toward the carrying path L in the chamber 1. The term gas space in this specification means a film formation chamber Dp where the film formation unit 4a performs film formation.

Figure 5:
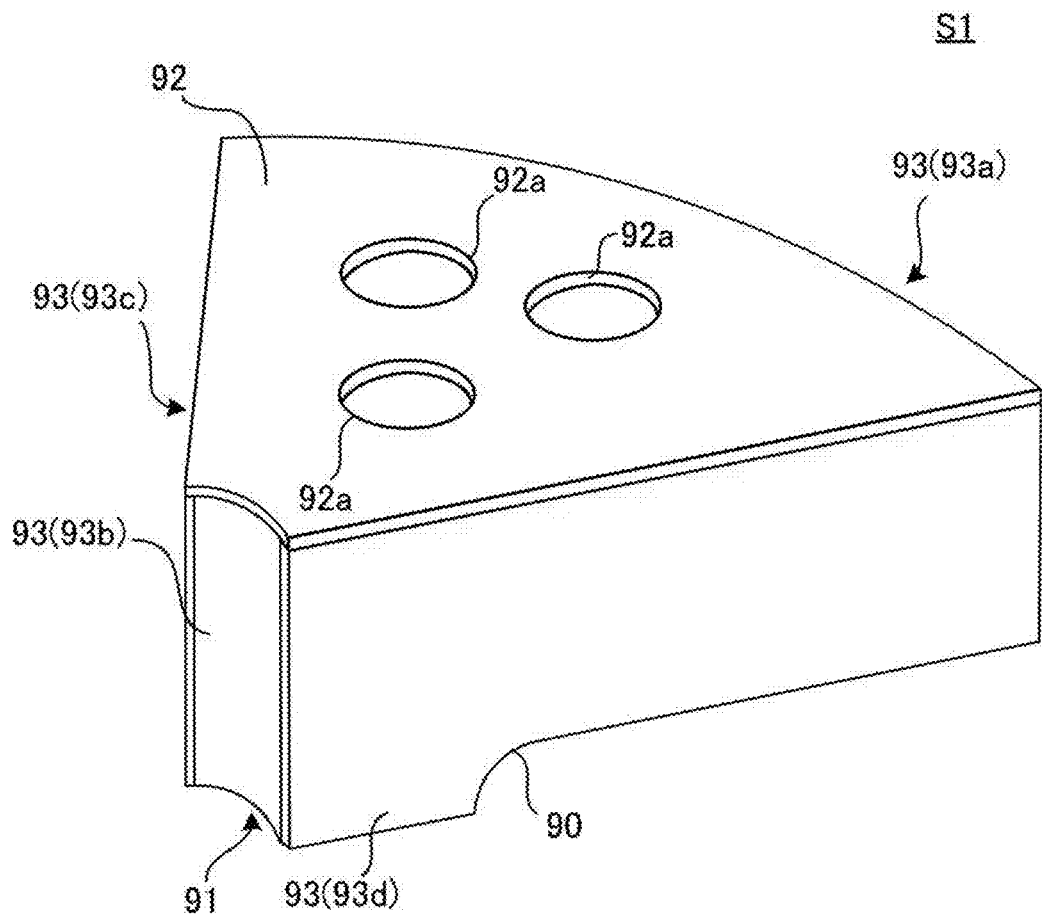
FIG. 5 is a perspective view illustrating a shielding member of a film formation unit.

The shielding member S1 includes a cover portion 92 and a side face portion 93. The cover portion 92 is a member that forms a ceiling of the film formation chamber Dp. As illustrated in FIGS. 2 and 5, the cover portion 92 is a plate body in a substantially sector shape arranged in parallel with the flat surface of the rotation table 3. In the cover portion 92, a target hole 92a that has the same size and shape of the target 61 is formed at a position corresponding to each target 61 so that each target 61 is exposed in the film formation chamber Dp. Moreover, a tip of the sputter gas introducing unit 8 is extended to the proximity of the target 61 in the shielding member S1. That is, the sputter gas introducing unit 8 is a gas supply unit that supplies the sputter gas G1 in the film formation chamber Dp where the sputter gas G1 is introduced.

The side face portion 93 is a member that forms side faces around the circumferential edge of the film formation chamber Dp. The side face portion 93 includes an outer circumference wall 93a, an inner circumference wall 93b, and the dividing walls 93c and 93d. The outer circumference wall 93a and the inner circumference wall 93b are also in a rectangular cuboid shape curved in a circular arc shape, and are a tabular member extended in the axial direction of the rotation table 3. The upper edge of the outer circumference wall 93a is attached to the outer edge of the cover portion 92. The upper edge of the inner circumference wall 93b is attached to the inner edge of the cover portion 92.

The dividing walls 93c and 93d are in a flat rectangular cuboid shape, and are a tabular member extended in the axial direction of the rotation table 3. The dividing walls 93c and 93d face with each other in the carrying direction of the workpiece W. The respective upper edges of the dividing walls 93c and 93d are attached to the pair of radial edges of the cover portion 92. The joined portion between the cover portion 92 and the side face portion 93 is hermetically sealed. Note that the cover portion 92 and the side face portion 93 may be formed integrally with each other, i.e., may be formed continuously by a common material. According to such a shielding member S1, the upper portion and the side faces around the circumferential edge are covered by the cover portion 92 and the side face portion 93, and a part of the film formation chamber Dp that has a opening on the side facing the workpiece W is formed. Note that it is not always necessary for the shielding member S1 to include all of the outer circumference wall 93a, the inner circumference wall 93b, and the dividing walls 93c and 93d. For example, the shielding member S1 may be formed by attaching only the dividing walls 93c and 93d to the cover portion 92.

Although this film formation chamber Dp is a region where the most part of film forming is performed, a leakage of the film formation materials from the film formation chamber Dp occurs even outside the film formation chamber Dp, and there is a slight film deposition at such an outside region. That is, a film formation region where film formation is performed by the film formation unit 4a is a slightly wider region than the film formation chamber Dp that is defined by the shielding member S1.

The shielding member S1 is formed in a substantially sector shape that increases a diameter from the center of the rotation table 3 in the radial direction toward the external side in a planar view. The opening 91 of the shielding member S1 is also in a substantially sector shape. A speed at which the workpiece W held on the rotation table 3 passes through the position facing the opening 91 becomes slow toward the center of the rotation table 3 in the radial direction, and becomes fast toward the external side. Accordingly, when the opening 91 is simply in a rectangular or a square shape, a difference occurs in time at which the workpiece W passes through the position facing the opening 91 between the center side and the external side in the radial direction. By increasing the diameter of the opening 91 from the center side toward the external side in the radial direction, a time for the workpiece W to pass through the opening 91 can be made constant, thereby preventing an occurrence of a difference in film formation amount due to the difference in passing time. When, however, as long as a difference in passing time is within a level that does not become a problem on products, a rectangular shape or a square shape may be adopted. An example material of the shielding member S1 is aluminum or SUS.

Figure 6:
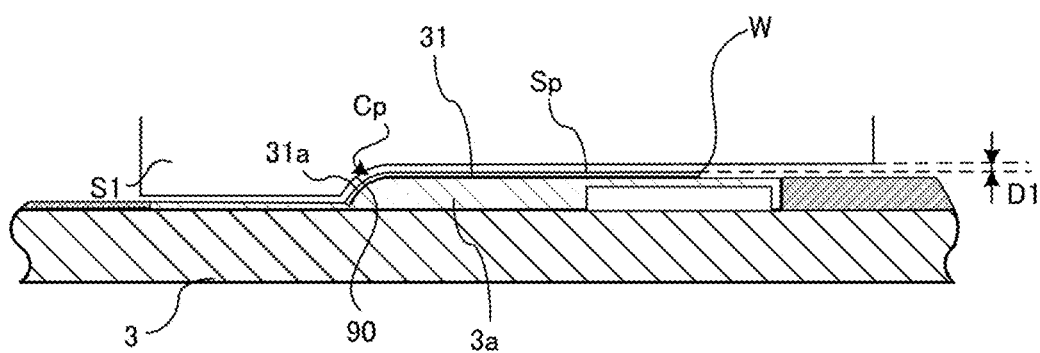
FIG. 6 is a partial enlarged cross-sectional view illustrating a clearance between the shielding member and the workpiece.

As illustrated in FIG. 6, between the respective lower ends of the dividing walls 93c and 93d and the rotation table 3, a clearance D1 through which the workpiece W on the rotating rotation table 3 can pass is formed. That is, the heights of the dividing walls 93c and 93d are set in such a way that a slight clearance is created between the lower edge of the shielding member S1 and the workpiece W.

More specifically, as illustrated in FIG. 6, the shielding member S1 has the concavity 90 along with the convexity Cp of the workpiece W mounted on the holder unit 3a. The wordings along the convexity Cp mean a shape that follows the convexity Cp. According to this embodiment, the concavity 90 is a curved surface along the curvature of the convexity Cp. However, the clearance D1 is formed as described above between the concavity 90 and the convexity Cp. That is, the respective lower edges of the dividing walls 93c and 93d that include the concavity 90 are formed in a shape along the processing target surface Sp of the workpiece W in a non-contact manner. It is preferable that the clearance D1 between the processing target surface Sp of the workpiece W and the shielding member S1 is preferably 5 mm or less including the clearance between the convexity Cp and the concavity 90. This is because to allow the workpiece W to pass through, and also to maintain the internal pressure of the film formation chamber Dp. Moreover, this is also for reducing a leakage of the reactive gas as much as possible.

Figure 7:
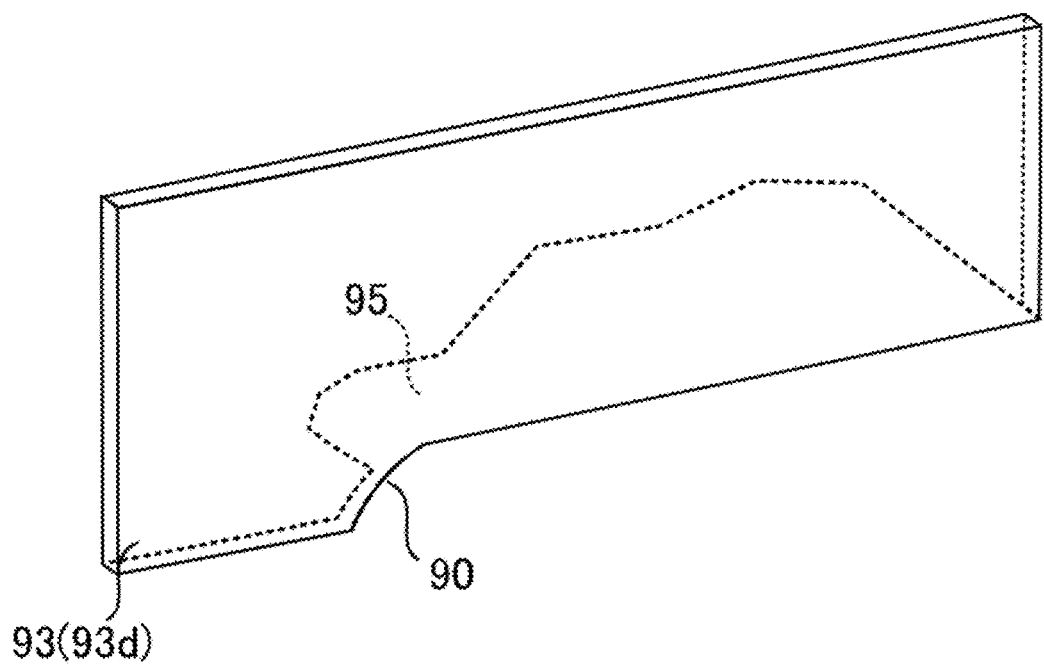
FIG. 7 is a transparent perspective view illustrating a compensation plate provided on the shielding member.

Moreover, as illustrated in FIG. 7, the shielding member S1 is provided with a compensation plate 95. The compensation plate 95 is a member that adjusts a film thickness distribution of a film to be formed. The compensation plate 95 is a tabular member that forms, in a part of the film formation chamber Dp, a region where sputter particles of the film formation materials are blocked. The film thickness distribution is compensated by this compensation plate 95. The compensation plate 95 shields the sputtered particles in such a way that the sputter particles do not sticking to, beyond the necessity, a portion where a large amount of the sputtered particles stick and a film is likely to become thick. That is, the compensation plate 95 is a shielding member that blocks the film formation materials.

More specifically, the compensation plate 95 is provided at a lower end of the dividing wall 93d that is a dividing wall at the upstream side of the carrying direction of the workpiece W. That is, the compensation plate 95 is provided at a position facing the processing target surface Sp of the workpiece W. The compensation plate 95 is provided so as to protrude in the film formation chamber Dp from the dividing wall 93d and to cover the flat surface of the workpiece W and a part of the convexity Cp from the flat surface. The compensation plate 95 is formed in a shape along the workpiece W, and is not in a tabular shape but is in a solid shape that has a flat surface and a convexity. More specifically, when the workpiece W that passes through the film formation chamber Dp and the compensation plate 95 are viewed in an orthogonal direction to the radial direction, it is appropriate if the shape of a surface on the compensation plate 95 at the processing target-surface-Sp side matches the shape of the processing target surface Sp.

Note that the compensation plate 95 may be formed integrally with the shielding member S1. Moreover, such a plate may be formed of a separate member from the shielding member S1, and may be attachable and detachable relative to the shielding member S1. In addition, a support member may be provided to support the compensation plate 95 which is a separate member from the shielding member S1 so as to locate the plate in the vicinity of the shielding member S1. The correction plate 95 is preferably provided on the lower-end side of the shield member S1 so that the plate can be brought close to the workpiece W. However, since the effect of blocking the scattered sputter particles is achievable also when the compensation plate 95 is apart from the workpiece W, such a plate may be provided at a position other than the lower-end side of the shielding member S1.

Figure 10:
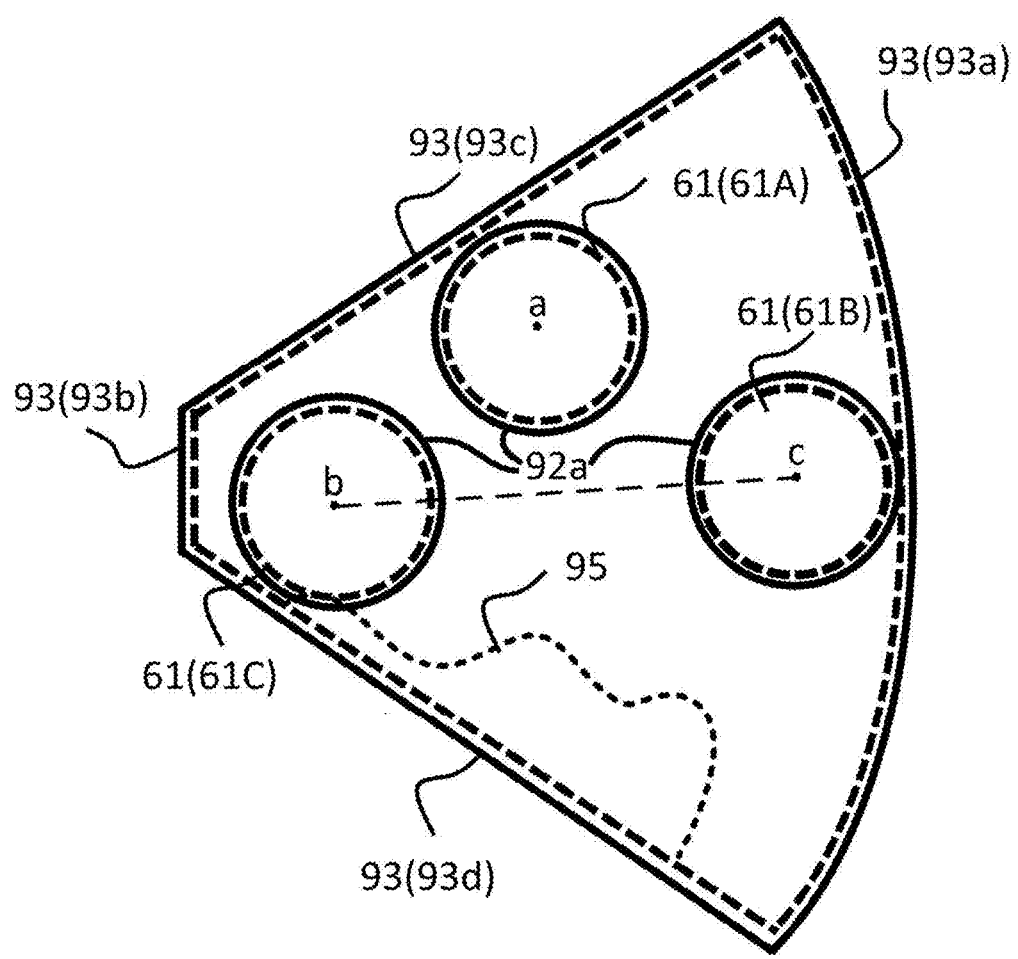
FIG. 10 is a plan view illustrating a positional relationship between the compensation plate and a target provided on the shielding member.

Note that the sputter particles are dispersed in a vacuum in accordance with the Kunudsen's cosine rule, such particles most stick right under the target 61. Since the shielding member S1 is located at a position apart from the position right under the target 61, the sputter particles that fly to the nearby location to the shielding member S1 becomes less than at the position right under the target 61. Accordingly, by attaching the compensation plate 95 at the nearby location to the shielding member S1, an adverse effect due to an error caused during machining and an assembling error of the compensation plate 95 are reduced. Hence, when the compensation plate 95 is provided on the partition 93d at the upstream side in the carrying direction, it is preferable that the one target 61A that has the center arranged at the position that forms the vertex of the isosceles triangle together with the respective centers of the other two targets 61B and 61C should be located at the dividing-wall-93c side at the downstream side in the carrying direction. In other words, when the center of the remaining one target is shifted from a line connecting the centers of the two targets among the three targets, the compensation plate 95 is preferably provided on a side opposite to the remaining one target with respect to the line connecting the two targets. More specifically, when the target 61A placed at the position shifted in the carrying direction from the line that connects the respective centers b and c of the targets 61B and 61C is located near the dividing-wall-93c side at the downstream side, it is preferable that the compensation plate 95 should be provided on the dividing wall 93d at the opposite side (the upstream side) from the target 61A in the carrying direction with respect to the line connecting b and c (see FIG. 10). Moreover, it is not always necessary that the compensation plate 95 is provided on the dividing wall 93d at the upstream side in the carrying direction of the workpiece W. For example, such a plate can be also provided on the dividing wall 93c at the downstream side in the carrying direction.

When, however, the compensation plate 95 is arranged in such a way that one end of the compensation plate 95 is attached to the shielding member S1, by attaching the compensation plate 95 to the dividing wall 93d at the upstream side, even if the end at the unattached side sags down due to the influence of plasma heat or the like, at least a frontal collision with the side face of the workpiece W and with the side face of the holder unit 3a can be avoided, and thus a damage to the compensation plate can be suppressed.

As described above, according to this embodiment, the workpiece W includes the convexity Cp or the concavity Rp in a part of the processing target surface Sp. When film formation is executed on such a workpiece W using the film formation apparatus 100, a film formation rate to a part of the convexity Cp on the workpiece W at the inner circumference side decreases. The term film formation rate means an amount of deposited film formation material or a film thickness per a unit time. More specifically the convexity Cp of the workpiece W on the rotation table 3 is curved so as to sag down toward the inner circumference side of the rotation table 3. Hence, an end portion of the convexity Cp at the inner circumference side becomes a vertical surface substantially vertical to the flat surface of the workpiece W. The film formation rate decreases toward the vertical surface relative to the flat surface (horizontal surface). Therefore, the film formation rate remarkably differs on the surface that forms the convexity Cp.

Hence, although the compensation plate 95 covers a part of the convexity Cp of the workpiece W, it is not provided so as to cover the entire convexity Cp. The wordings that the compensation plate 95 covers the workpiece W mean that the compensation plate 95 overlaps the workpiece W in the axial direction. Note that the compensation plate 95 covers a part of the opening 91 of the shielding member S1.

The term a part of the convexity Cp covered by the compensation plate 95 means a portion where the film formation rate has not reached the minimum level even on the surface constituting the convexity Cp. That is, the compensation plate 95 is configured to expose a part of the convexity Cp at the inner circumference side where the film formation rate becomes the minimum level. The wordings that the compensation plate 95 exposes the workpiece W mean that the compensation plate 95 and the workpiece W do not overlap with each other in the axial direction. As described above, when the workpiece W is carried to the film formation unit 4a by the rotation table 3 and when the workpiece W passes through the position facing the film formation unit 4a as described above, the compensation plate 95 overlaps the workpiece W in the axial direction. However, the compensation plate 95 is not provided relative to the portion of the convexity Cp at the inner-circumference side where the film formation rate becomes the minimum level. Accordingly, even if the compensation plate 95 is located at the position overlapping the workpiece W in the axial direction, the portion of the convexity Cp at the inner-circumference side where the film formation rate becomes the minimum level is still exposed.

The term minimum level means that the film formation rate becomes equal to or lower than a predetermined value. The film thickness distribution is calculated from: an average value±{(maximum value−minimum value)/(maximum value+minimum value)}×100. A part "±{(maximum value−minimum value)/(maximum value+minimum value)}×100" is an error. The predetermined value is a value of the film formation rate regarding a film thickness part X where the value of {(X−minimum value)/(X+minimum value)}×100 relative to the minimum value of the film thickness distribution becomes two or less.

How far the compensation plate 95 covers the part of the convexity Cp of the workpiece W can be decided based on the film formation rate obtained by performing the film forming processing on the workpiece W using a shielding member that is not provided with the compensation plate 95, and by calculating the film formation rate for each predetermined position on the rotation table 3 in the radial direction from the film thickness distribution. Note that the width of the compensation plate 95 in the circumferential direction can be decided based on the obtained film formation rate. What is important is that, when the workpiece W in the solid shape partially includes the convexity Cp, the film formation rate decreases on the surface constituting the convexity Cp due to a curved shape of the convexity Cp. Accordingly, the compensation plate 95 is configured to expose the part of the convexity Cp at the inner circumference side where the film formation rate becomes the minimum level, and to always cover the flat surface of the workpiece W and a part of the convexity Cp.

Moreover, the compensation plate 95 is configured such that the distance from the workpiece W is constant. As described above, the compensation plate 95 is configured to cover the flat surface of the workpiece W and the part of the convexity Cp. In this case, the compensation plate 95 is in a solid shape along the workpiece W. Hence, the distance between the compensation plate 95 and the flat surface of the workpiece W, and the distance between the compensation plate 95 and the convexity Cp of the workpiece W is consistent with each other. It is preferable that the distance between the compensation plate 95 and the workpiece W should be 5 mm or less. This allows the workpiece W to pass through and maintains the internal pressure of the film formation chamber Dp.

The distance between the compensation plate 95 and the workpiece W can be adjusted by keeping the distance between the facing surface 31 of the tray as the holder unit 3a and the convexity 31a thereof, and, the compensation plate 95 constant. Moreover, it is appropriate if, when a concavity is formed in the rotation table 3 to hold the workpiece W, the distance between the concaved facing surface 31 of the rotation table 3 as the holder unit 3a and the convexity 31a thereof, and, the compensation plate 95 is kept constant. That is, the shape of the holder unit 3a can be designed as appropriate so as to maintain the constant distance between the compensation plate 95 and the workpiece W. Moreover, the shape of the shielding member S1 can be designed as appropriate in accordance with the shape of the holder unit 3a.

According to such a shielding member S1 as illustrated in FIG. 2, a film formation position where the film is formed on the workpiece W by the sputter source 6 is partitioned. The shielding member S1 suppresses that the sputter gas G1 and the film formation materials at the film formation position are diffused into the chamber 1 from the film formation chamber Dp.

(Film Processing Unit)

The film processing unit 4b is installed on the lid body 1a of the chamber 1, and includes an electrode 10 formed in a cylindrical shape (a "cylindrical electrode" below). The cylindrical electrode 10 is a plasma source that produces plasma for performing a plasma processing on the workpiece W that is passing through the carrying path L in a gas space where the process gas G2 is introduced. The gas space in this case is a film processing chamber Fp where film processing by the film processing unit 4b is performed.

The cylindrical electrode 10 according to this embodiment is in a rectangular cylindrical shape, has an opening 11 at one end, and is closed at the other end. The cylindrical electrode 10 passes through a through-hole provided in the lid body 1a of the chamber 1, has the one end where the opening 11 is formed located inside the chamber 1, and has the closed end located outside the chamber 1. The cylindrical electrode 10 is supported by the circumferential edge of the through-hole of the chamber 1 via an insulation material. The opening 11 of the cylindrical electrode 10 is positioned so as to face the carrying path L formed on the rotation table 3. That is, the rotation table 3 carries the workpiece W so as to pass through the position facing the opening 11. Moreover, the position facing the opening 11 becomes a passing position for the workpiece W.

As illustrated in FIGS. 1 and 2, the cylindrical electrode 10 and the opening 11 thereof are formed in a substantially sector shape that increases the diameter from the center side of the rotation table 3 toward the external side in the radial direction when viewed from the top, like the shielding member S1. The reason why the substantially sector shape is adopted is the same as that of the shielding member S1, and as long as a difference in passing time does not become a problem on products, a rectangular shape or a square shape may be adopted.

The cylindrical electrode 10 is placed inside the shielding member S2. The shielding member S2 can be considered as a shielding member S which forms a part of a gas space where the process gas G2 is introduced and which has an opening 13a directed toward the carrying path L inside the chamber 1. Note that in the following description, when the shielding members S1 and S2 are not distinguished from each other, those may be also referred to as the shielding member S.

The process gas G2 causes activated species produced by plasma caused by an application of high frequency to be osmosed in the film deposited on the surface of the workpiece W, and to form a compound film. The process gas G2 can be changed as appropriate depending on the purpose of the process. When, for example, film oxidization is performed, oxygen is applied, when film nitridation is performed, nitrogen is applied, and when film oxidation and nitridation are performed, a mixture gas of oxygen and nitrogen is applied. Moreover, when etching is executed, an inert gas like as argon is applied as an etching gas. Note that in the following description, when the sputter gas G1 and the process gas G2 are not distinguished from each other, those may be also referred to as a reactive gas G.

The shielding member S2 includes an external shield 12 and an internal shield 13. As described above, the cylindrical electrode 10 passes through the through-hole of the chamber 1, and has the part exposed to the exterior of the chamber 1. As illustrated in FIG. 2, the exposed part of the cylindrical electrode 10 to the exterior of the chamber 1 is covered by the external shield 12. The internal space of the chamber 1 is maintained hermetically by the external shield 12. The circumference of the part of the cylindrical electrode 10 in the chamber 1 is covered by the internal shield 13.

The internal shield 13 has a rectangular cylindrical shape similar to the cylindrical electrode 10, and is supported by the lid body 1a inside the chamber 1. Each cylinder side face of the internal shield 13 is provided substantially in parallel with each side face of the cylindrical electrode 10. The end face of the internal shield 13 that faces the rotation table 3 may be located at the same position as that of the opening 11 of the cylindrical electrode 10 in the height direction, or may be located below the opening 11. The end face of the internal shield 13 is an opening 13a. A flange 14 extended in parallel with the flat surface of the rotation table 3 and extended outwardly relative to the opening 13a is formed around this opening 13a. This flange 14 prevents the plasma produced in the cylindrical electrode 10 from flowing out the exterior of the internal shield 13.

Moreover, the shielding member S2 includes an unillustrated concavity in the opening 13a like the concavity 90 of the shielding member S1. This concavity has a shape along the convexity Cp of the workpiece W mounted on the holder unit 3a. The term along the convexity Cp means a shape that follows the convexity Cp. According to this embodiment, the concavity of the shielding member S2 is a curved surface along the curved surface of the convexity Cp. However, a clearance where the workpiece W on the rotation table 3 can pass through is formed between the concavity of the opening 13a and the convexity Cp. That is, at the lower edge of the opening 13a containing the concavity of the shielding member S2, a shape that follows the processing target surface Sp of the workpiece W is formed in a non-contact manner. It is preferable that the clearance between the processing target surface Sp of the workpiece W and the shielding member S2 should be 5 mm or less including the clearance between the convexity Cp and the concavity. This is because to allow the workpiece W to pass through, and also to maintain the internal pressure of the film processing chamber Fp. Moreover, like the shielding member S2, a concavity may be provided in the opening 11 of the cylindrical electrode 10.

The workpiece W carried by the rotation table 3 passes through the clearance between the rotation table 3 and the opening 13a, is carried to a position facing the opening 11 of the cylindrical electrode 10, passes again through the clearance between the rotation table 3 and the opening 13a, and is carried out from the position facing the opening 11 of the cylindrical electrode 10.

An RF power supply 15 for applying a high-frequency voltage is connected to the cylindrical electrode 10. A matching box 21 that is a matching circuit is connected in series to the output side of the RF power supply 15. The RF power supply 15 is also connected to the chamber 1. The cylindrical electrode 10 functions as an anode, and the rotation table 3 that stands upright from the chamber 1 functions as a cathode. The matching box 21 stabilizes the plasma discharge by matching the impedance on the input side and the output side. Note that the chamber 1 and the rotation table 3 are grounded. The internal shield 13 that includes the flange 14 is also grounded.

Moreover, a process gas introducing unit 16 is connected to the cylindrical electrode 10, and the process gas G2 is introduced inside the cylindrical electrode 10 located inside the shielding member S2 from an external process gas supply source via the process gas introducing unit 16. The process gas introducing unit 16 is a gas supply unit that supplies the process gas G2 in the film processing chamber Fp. Both the RF power supply 15 and the process gas introducing unit 16 are connected to the cylindrical electrode 10 via the through-hole provided in the external shield 12.

[Load-Lock Unit]

A load-lock unit 5 which carries the unprocessed workpiece W into the chamber 1 from the exterior with the vacuumed condition in the chamber 1 being maintained, and which carries out the processed workpiece W to the exterior of the chamber 1 is provided between any one pair of the processing units 4. Moreover, according to this embodiment, the carrying direction of the workpiece W is in a counter clockwise direction in a planar view. Needless to say, this is merely an example, and the carrying direction, the kind, sequence, and number of the processing unit are not limited to any particular structures, and can be designed as appropriate.

[Control Unit]

The film formation apparatus 100 further includes a control unit 20. The control unit 20 includes an arithmetic processing unit called a processor, such as a PLC or a CPU. The control unit 20 executes a control with respect to the introduction and discharge of the sputter gas G1 and the process gas G2 relative to the chamber 1, a control on the DC power supply 7 and the RF power supply 15, and a control on the rotating speed of the rotation table 3, etc.

[Operation]

An operation of the film formation apparatus 100 according to this embodiment will be described. As is indicated by a black arrow in FIG. 2, the interior of the chamber 1 that is hermetically sealed by the lid body 1a is exhausted by the exhausting unit 2, and becomes a vacuumed condition. With the internal vacuumed condition of the chamber 1 being maintained, the unprocessed workpiece W is carried in the chamber 1 from the load-lock unit 5. The carried-in workpiece W is held by the holder unit 3a of the rotation table 3 which is to be positioned in sequence by the load-lock unit 5. Moreover, by continuously rotating the rotation table 3, the individual workpieces W are rotated and carried along the carrying path L, and pass through the position facing each processing unit 4.

In the film formation unit 4a, the sputter gas G1 is introduced from the sputter gas introducing unit 8, and a DC voltage is applied to the sputter source 6 from the DC power supply 7. The plasma sputter gas G1 is produced by DC voltage application, and ions are produced. When the produced ions collide with the target 61, the materials of the target 61 are beaten out. The beaten-out materials are deposited on the workpiece W that passes through the position facing the film forming unit 4a, and the thin film is formed on the workpiece W. However, it is unnecessary to form the film at all the film formation units 4a. As an example, an $SiO_2$ film is formed on the workpiece W by DC sputtering using the single film formation unit 4a.

At the time of film formation by the film formation unit 4a, a flow of the sputter gas G1 is generated between the internal side of the shielding member S1 and the external side thereof. Hence, some sputter particles beaten out from the target collide with the molecules of reactive gas G at this position, and are scattered. According to this embodiment, the shielding member S1 is provided with the compensation plate 95. Accordingly, the sputter particles scattered above the position to which the compensation plate 95 is attached are prevented from being deposited on the workpiece W, and thus a uniform film thickness distribution is attained. Since the compensation plate 95 has a solid shape along the shape of the processing target surface SP of the workpiece W, a deposition of the scattered sputter particles is further surely prevented. Moreover, because the workpiece W is configured to expose the part where the film formation rate is at the minimum level, the film thickness distribution is made uniform without decreasing a film formation efficiency at the part where the film formation rate is low.

Figure 8:
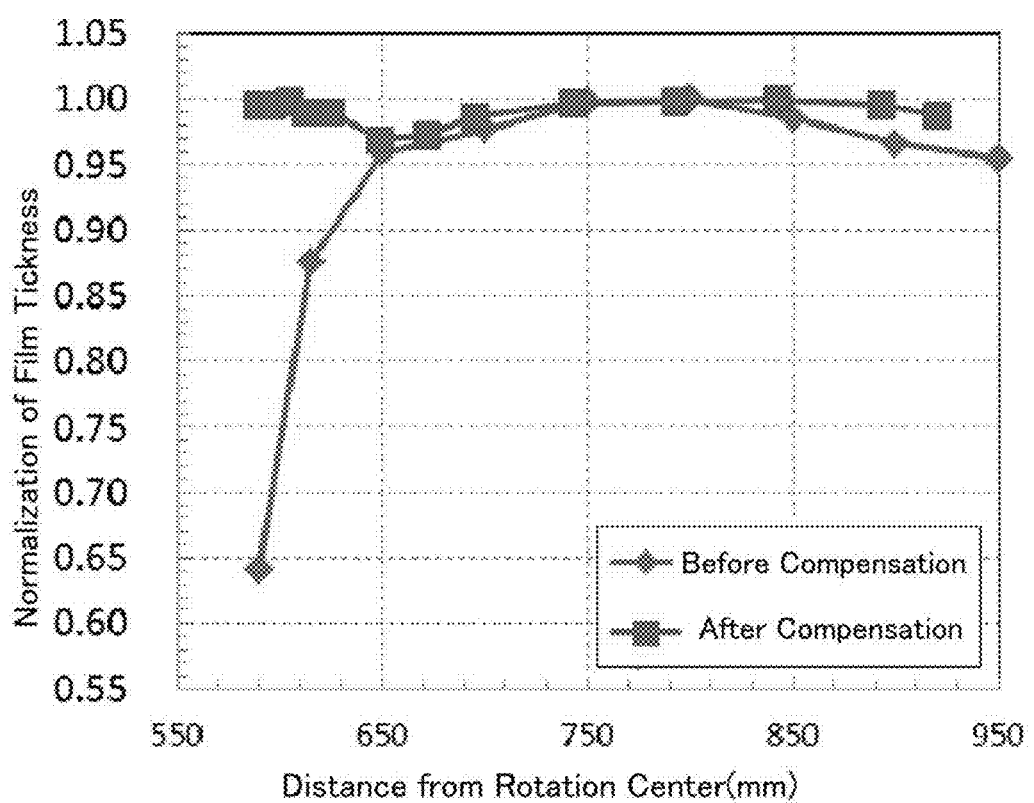
FIG. 8 is a graph illustrating a film thickness distribution before and after compensation.

A film formation result executed using such a compensation plate 95 according to this embodiment will be described with reference to a graph of FIG. 8. FIG. 8 illustrates a graph that indicates a film thickness distribution with the horizontal axis representing a distance from the rotation center and the vertical axis representing normalized film thicknesses. As is clear from FIG. 8, when the workpiece W in a solid shape was subjected to film formation without using the compensation plate 95, a decrease in film thickness of a formed film occurred at the inner-circumference side where the distance from the rotation center was 650 mm or less. This decrease in film thickness occurred relative to the convexity Cp of the workpiece W. When the film was formed without using the compensation plate 95, a film thickness uniformity was ±21.9%. In contrast, when the same workpiece W was subjected to the film formation using the compensation plate 95, the film thickness is not partially reduced and a uniform film thickness distribution is obtained. When the film was formed using the compensation plate 95, the film thickness uniformity was improved to ±1.6%.

The workpiece W on which the film formation has been performed by the film formation unit 4a is subsequently carried by the rotation table 3 along the carrying path L, and passes through the position facing the opening 11 of the cylindrical electrode 10, i.e., a film processing position in the film processing unit 4b. As described above, according to this embodiment, a post-oxidization is performed by the film processing unit 4b as an example. In the film processing unit 4b, an oxygen gas that is the process gas is introduced in the cylindrical electrode 10 from the process gas introducing unit 16, and a high-frequency voltage is applied to the cylindrical electrode 10 from the RF power supply 15. Plasma oxygen gas is obtained by application of the high-frequency voltage, and electrons, ions, radicals, etc., are produced. Plasma flows from the opening 11 of the cylindrical electrode 10 that is the anode to the rotation table 3 that is the cathode. The thin film is post-oxidized since the ions in plasma collide with the thin film on the workpiece W which passes through under the opening 11.

[Action and Effect]

(1) The film formation apparatus 100 according to this Embodiment includes: the chamber 1 that has an interior to be vacuumed; the carrying unit which is provided in the chamber 1, and which carries the workpiece W that has a processing target surface Sp in a solid shape along the circular carrying path; the film formation unit 4a that causes the film formation material to be deposited by sputtering on the workpiece that is being carried by the carrying unit to form a film thereon; and the shielding member S1 which has the opening 91 located at a side where the workpiece W passes through, and which forms the film formation chamber Dp where the film formation by the film formation unit 4a is performed, in which: the compensation plate 95 that protrudes in the film formation chamber Dp is provided; and the compensation plate 95 has a solid shape along the shape of the processing target surface SP of the workpiece W, and is provided at the position facing the workpiece W.

According to conventional technologies, when a film forming process is performed using the plurality of targets 61 and when a film thickness distribution to be deposited on the workpiece W does not become uniform, adjustment based on power control is executed. When, however, the workpiece W has a solid shape, if the power to be applied to the target 61 for film formation to the solid-shape portion is increased, together with the thickening of the film at the portion where the film formation rate is the lowest, the film at other portions also becomes thick. Accordingly, even if the film thickness distribution is changeable, it is difficult to attain a uniform film thickness distribution.

Moreover, when the film thickness distribution is adjusted using, for example, a compensation plate in a planar shape, a clearance between the workpiece W in a solid shape and the compensation plate does not become uniform, and the clearance increases or decreases at the solid-shape portion. In this case, a new flow of the sputter gas G1 is caused by the compensation plate in the planar shape, and the way how the sputter particles are scattered changes from the way before the compensation plate is attached. Accordingly, it is difficult to attain a uniform film thickness distribution.

In contrast, the compensation plate 95 according to this embodiment has a solid shape along the processing target surface Sp of the workpiece W. By bending, etc., the compensation plate 95 in accordance with the shape of the workpiece W, the scattered sputter particles are prevented from being deposited on the processing target surface Sp of the workpiece W. Therefore, the film thickness distribution of the film formed on the workpiece W can be adjusted uniformly.

The compensation plate 95 has a solid shape along the processing target surface Sp of the workpiece W. Hence, a distance between the compensation plate 95 and the workpiece W becomes constant, and thus a new flow of the sputter gas G1 caused by the compensation plate 95 is suppressed. Hence, the sputter particles are prevented from being scattered, and thus the film thickness distribution can be made further precisely uniform. Moreover, in comparison with the compensation plate in a flat plate shape, a distance to the convexity Cp of the workpiece becomes short. Hence, even on the convexity Cp of the workpiece W, deposition of the sputter particles scattered above the attaching position of the correction plate 95 can be more reliably prevented a more uniform film thickness distribution can be attained.

As described above, since the sputter particles are dispersed in vacuum in accordance with the Kunudsen's cosine rule, most of the sputter particles stick right under the target. Moreover, the shape of the compensation plate 95 involves a dimensional error caused by machining. Moreover, there is also an assembly error by an assembling worker. That is, when the compensation plate 95 is provided right under the target, the adverse effect of the dimensional error and of the assembling error becomes the maximum. In order to achieve a high film thickness uniformity that is within ±2% from a designed value, it is necessary to take the adverse effect of the above-described errors into consideration. Since the nearby portion to the shielding member S1 is located apart from the location right under the target 61, the amount of the flying sputter particles becomes less than that at the location right under the target 61. This reduces the adverse effect by the above-described errors.

In particular, by providing the compensation plate 95 at the lower end of the shielding member S1, the shape of the compensation plate 95 can be made small, and thus the error caused by machining is reduced. Moreover, when the compensation plate 95 is provided at the location right under the target 61, the plate is connected to the outer circumference wall 93a and the inner circumference wall 93b of the shield member S1 by point contact. When the compensation plate 95 is heated by plasma, heat can be exchanged only at a point contact portion, so that the cooling efficiency is not enough. When the compensation plate 95 is provided at the lower end of the shielding member S1, a contact to the compensation plate 95 can be achieved at the end portion of the shielding member S1 that has a large heat capacity. Hence, the heat accumulated in the compensation plate 95 can be dissipated to the shielding member S1, and thus the cooling efficiency can be improved.

(2) The workpiece W includes the convexity Cp and the flat surface in the surface facing the film formation unit 4a, the shielding member S1 includes the concavity 90 along the convexity Cp of the workpiece in an opened end, and the compensation plate 95 is provided so as to cover a part of the workpiece W and the flat surface thereof at the opened end of the shielding member S1.

The compensation plate 95 is configured to cover a part of the convexity Cp that is the solid-shape portion of the workpiece W, but to expose the other portions. In particular, at the solid-shape portion of the workpiece W, the film thickness distribution is not likely to become uniform.
Therefore, the film thickness distribution can be adjusted more uniformly by using the compensation plate 95 that covers a part of the convexity Cp where the film formation rate is high and exposes apart where the film formation rate is low.

(3) The compensation plate 95 is configured to expose a part of the workpiece W where the film formation rate is at the minimum level.

Since the compensation plate 95 exposes the part where the film formation rate is at the minimum level, the film thickness distribution can be made uniform without decreasing the film formation efficiency at the part where the film formation rate is low.

(4) The distance between the compensation plate 95 and the processing target surface Sp of the workpiece W is 5 mm or less.

By setting the distance between the compensation plate 95 and the workpiece W to 5 mm or less, the workpiece W is allowed to pass therethrough, while at the same time, the internal pressure of the internal film formation chamber Dp is maintainable. Moreover, the shielding member S1 is located so as to be apart from the target 61. Accordingly, when the distance between the compensation plate 95 and the workpiece W is 5 mm or more, in order to block the sputter particles, it is necessary to elongate the length of the compensation plate 95. Provided that, for example, sputter particles sticking to the workpiece W at an incident angle θ are shielded, a right-angled triangle formed by an incident line and a normal line of the sputter particles, and the compensation plate 95 is now taken into consideration. In this case, the compensation plate 95 becomes an opposite side of the right-angled triangle. The farther the opposite side is apart from θ, the longer the opposite side becomes. Hence, the farther the compensation plate 95 is from the workpiece, the longer the length of the compensation plate 95 for shielding becomes. That is, by setting the distance between the compensation plate 95 and the workpiece W to 5 mm or less, the length of the compensation plate 95 for blocking the sputter particles can be reduced. Accordingly, the error by machining can be reduced, and thus the film thickness distribution can be further surely made uniform.

[Modified Examples]

The embodiment of the present disclosure is not limited to the above-described embodiment, and also involves the following modified examples.

Figure 9A:
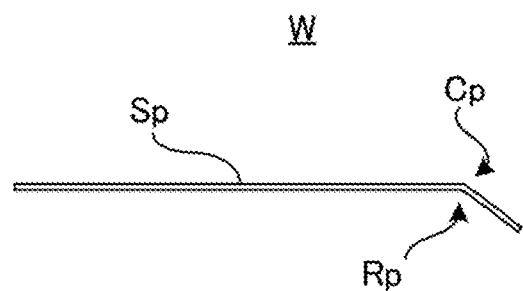
FIG. 9A is a side view.
Figure 9B:
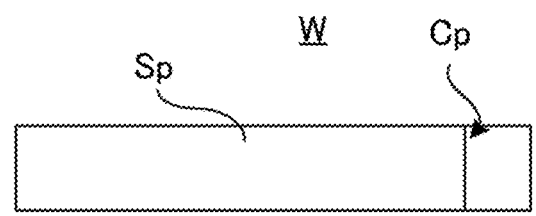
FIG. 9B is a plan view.
Figure 9C:
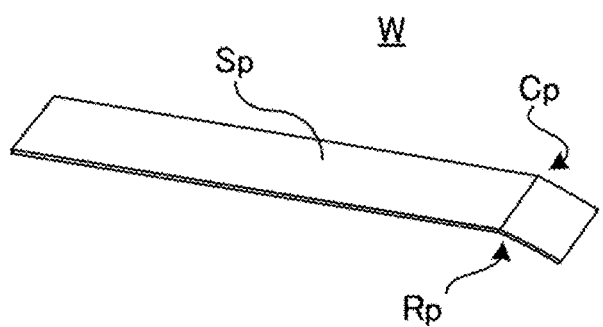
FIG. 9C is a perspective view illustrating a workpiece according to a modified example.

(1) The shape, kind, and material of the workpiece W are not limited to the specific ones. For example, as illustrated in FIGS. 9A to 9C, the workpiece W may have the processing target surface Sp configured with a plurality of planes that have different angles, and may have the convexity Cp formed by a portion that interconnects the different planes. Moreover, depending on the thickness of the workpiece W, the processing target surface Sp of the workpiece W may protrude upwardly beyond the facing surface 31 of the tray. In this case, the shield members S1 and S2 are provided with respective concavities that avoid the protruding portion of the workpiece W. As materials of the workpiece W, materials including conductive materials such as metal or carbon, materials including insulators such as glass or rubber, or materials including a semiconductor such as silicon may be used. Because it is appropriate if the concavities of the shielding members S1 and S2 have a shape along the convexity Cp of the workpiece W, various shapes can be formed in accordance with the shape of the workpiece W. Moreover, because it is appropriate if the convexity 31a of the tray has a shape along the respective concavities of the shielding members S1 and S2, various shapes can be formed in accordance with the shape of the concavity.

Furthermore, although the surface of the workpiece W subjected to film formation is a surface that includes the convexity Cp in the above-described embodiment, the surface at the opposite side may be subjected to the film formation. For example, the surface that includes the concavity Rp may be subjected to the film formation. In this case, it is appropriate if the shielding members S1 and S2 includes respective convexities along the concavity Rp. Moreover, it is appropriate if the tray includes the concavity along the concavity Rp and along the respective convexities of the shielding members S1 and S2. When the film formation is performed on the concavity Rp, a boundary between the concavity Rp and the flat surface may have the lowest film formation rate. Accordingly, the compensation plate 95 may be formed by a tabular member divided into two pieces so as to expose a part of the concavity Rp.

Moreover, according to the above-described embodiment, although the workpiece W includes the convexity Cp provided at an end, a workpiece that includes respective convexities at both ends, and a workpiece that has a cross-section in a circular arc shape and forming a convexity as a whole may be adopted. As long as the workpiece W has a constant height in the carrying direction (the orthogonal direction to the radial direction), by causing the compensation plate 95 according to the above-described embodiment to have a shape along the processing target surface of the workpiece W, a constant distance between the workpiece W and the compensation plate 95 can be achieved. Hence, it is necessary for the surface of the workpiece W to be processed to have a constant height in the orthogonal direction to the radial direction.

(2) In the above-described embodiment, although the carrying unit is the rotation table 3, the carrying unit is not limited to the rotation table 3. Trays and workpieces may be held by respective arms extended radially from a rotation center, and may be rotated. Moreover, the processing unit 4 may be located at the bottom-portion side of the chamber 1, and the positional relationship in vertical direction between the processing unit 4 and the rotation table 3 may be reversed. In this case, the surface of the rotation table 3 on which the holder unit 3a is installed becomes a surface directed downwardly when the rotation table 3 is in the horizontal direction, i.e., the lower surface. The opening of the shielding member S is directed upwardly.

(3) The installation surface for the film formation apparatus 100 may be a floor, a ceiling, or a side wall surface. In the above embodiment, although the description has been given of a case in which the holder unit 3a is provided on the upper surface of the rotation table 3 placed horizontally, this rotation table 3 is rotated on a horizontal plane, and the processing units 4 are placed above this rotation table 3, the present disclosure is not limited to this example case. For example, regarding the placement of the rotation table 3, it is not limited to the horizontal placement, but may be a vertical placement or an inclined placement. Moreover, the holder unit 3a may be provided on a surface that faces the rotation table 3. That is, according to the present disclosure, the direction of the rotational plane of the carrying unit may be any directions, and it is appropriate if the position of the holder unit 3a and that of the processing unit 4 are positions where the processing unit 4 faces the workpiece W held by the holder unit 3a.

(4) In the processing unit 4, an apparatus that produces plasma is not limited to the above-described embodiment. An apparatus that performs film formation and film processing by plasma processing using the reactive gas G is applicable.

(5) The cross-section of the shielding member S in the orthogonal direction to the rotation axis of the rotation table 3 is not limited to a substantially sector shape. It may be a rectangular cylindrical shape that has a rectangular cross-section, or may be a circular cylindrical shape that has a rounded rectangular cross-section may be adopted. When, however, the cross-section of the shielding member S is in a substantially sector shape, a difference in processing amount due to a difference in speed in radial direction can be compensated by a perimeter difference.

(6) The compensation plate 95 is not limited to a single tabular member. For example, the compensation plate 95 can be formed by engaging respective ends of a plurality of block plates and combining those plates. In this case, by changing the combination of the block plates, the shape and size of the compensation plate 95 can be easily changed.

(7) Although the embodiment of the present disclosure and modified examples of each component have been described above, such embodiment and modified examples of each component are merely presented as examples, and are not intended to limit the scope of the present disclosure. These novel embodiments described above can be carried out in other various forms, and various omissions, replacements, and modifications can be made thereto without departing from the scope of the present disclosure. Such embodiment and modified forms are within the scope of the present disclosure, and also within the scope of the invention as recited in the appended claims. How to combine the invention as recited in the respective claims is optional.

What is claimed is:

1. A film formation apparatus comprising:
   a chamber, an interior of the chamber is capable of being vacuumed;
   a carrying unit which is provided in the chamber, and which carries a workpiece that has a processing target surface in a solid shape along a circular carrying path;
   a film formation unit that causes a film formation material to be deposited by sputtering on the workpiece that is being carried by the carrying unit to form a film thereon; and
   a shielding member which has an opening located at a side where the workpiece passes through, and which forms a film formation chamber where the film formation by the film formation unit is performed,
   wherein a compensation plate that protrudes in the film formation chamber is provided,
   wherein the compensation plate has a solid shape along a shape of the processing target surface of the workpiece, and is provided at a position facing the workpiece,
   wherein the workpiece comprises a convexity and a flat surface in a surface facing the film formation unit;
   wherein the shielding member comprises a concavity along the convexity of the workpiece in an end of the opening;
   and wherein the compensation plate is provided so as to cover a part of the workpiece and the flat surface thereof at the end of the opening of the shielding member.

2. The film formation apparatus according to claim 1, wherein the compensation plate is configured to expose a part of the workpiece where a film formation rate is at the minimum level.

3. The film formation apparatus according to claim 1, wherein a distance between the compensation plate and the processing target surface of the workpiece is 5 mm or less.

4. The film formation apparatus according to claim 1, further comprising three circular targets in the film formation chamber,
   wherein a center of the one target is shifted from a line that connects respective centers of the two targets among the three targets, and
   wherein the compensation plate is provided on an opposite side to the one target with respect to the line connecting the centers of the two targets.

5. The film formation apparatus according to claim 1, wherein:
   the shielding member comprises dividing walls that face with each other in the carrying direction in which the workpiece is carried; and
   the compensation plate is attached to the dividing wall at an upstream side in the carrying direction.

6. The film formation apparatus according to claim 1, wherein:
   the shielding member comprises dividing walls that face with each other in the carrying direction in which the workpiece is carried; and
   the compensation plate is attached to the dividing walls so as to contact therewith.

7. A film formation apparatus comprising:
   a chamber, an interior of the chamber is capable of being vacuumed;
   a carrying unit which is provided in the chamber, and which carries a workpiece that has a processing target surface in a solid shape along a circular carrying path;
   a film formation unit that causes a film formation material to be deposited by sputtering on the workpiece that is being carried by the carrying unit to form a film thereon;
   a shielding member which has an opening located at a side where the workpiece passes through, and which forms a film formation chamber where the film formation by the film formation unit is performed; and
   three circular targets in the film formation chamber,
   wherein a compensation plate that protrudes in the film formation chamber is provided,
   wherein the compensation plate has a solid shape along a shape of the processing target surface of the workpiece, and is provided at a position facing the workpiece,
   wherein a center of the one target is shifted from a line that connects respective centers of the two targets among the three targets,
   and wherein the compensation plate is provided on an opposite side to the one target with respect to the line connecting the centers of the two targets.

8. The film formation apparatus according to claim 7, wherein the compensation plate is configured to expose a part of the workpiece where a film formation rate is at the minimum level.

9. The film formation apparatus according to claim 7, wherein a distance between the compensation plate and the processing target surface of the workpiece is 5 mm or less.

10. The film formation apparatus according to claim 7, wherein:
- the shielding member comprises dividing walls that face with each other in the carrying direction in which the workpiece is carried; and
- the compensation plate is attached to the dividing wall at an upstream side in the carrying direction.

11. The film formation apparatus according to claim 7, wherein:
- the shielding member comprises dividing walls that face with each other in the carrying direction in which the workpiece is carried; and
- the compensation plate is attached to the dividing walls so as to contact therewith.

* * * * *